United States Patent
Zhang

(10) Patent No.: US 10,505,158 B2
(45) Date of Patent: Dec. 10, 2019

(54) MANUFACTURING METHOD OF ORGANIC LIGHT EMITTING DIODE DISPLAY PANEL AND ORGANIC LIGHT EMITTING DIODE DISPLAY PANEL

(71) Applicant: Shenzhen China Star Optoelectronics Technology Co., Ltd., Shenzhen (CN)

(72) Inventor: Yunan Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/427,297

(22) Filed: May 30, 2019

(65) Prior Publication Data

US 2019/0288244 A1    Sep. 19, 2019

Related U.S. Application Data

(62) Division of application No. 15/557,130, filed on Sep. 11, 2017, now Pat. No. 10,355,248.

(30) Foreign Application Priority Data

May 27, 2017  (CN) .......................... 2017 1 0393573

(51) Int. Cl.
*H01L 51/52* (2006.01)
*H01L 51/56* (2006.01)
(Continued)

(52) U.S. Cl.
CPC .......... *H01L 51/56* (2013.01); *H01L 27/3241* (2013.01); *H01L 51/0005* (2013.01);
(Continued)

(58) Field of Classification Search
CPC ............. H01L 51/5012; H01L 51/0097; H01L 51/5056; H01L 51/56; H01L 51/5072;
(Continued)

(56) References Cited

U.S. PATENT DOCUMENTS

2014/0338750 A1* 11/2014 Iijima .................. C08G 61/123
                                                136/263
2015/0096610 A1*  4/2015 Okubo ................. C07D 519/00
                                                136/256

* cited by examiner

*Primary Examiner* — Long K Tran
(74) *Attorney, Agent, or Firm* — Leong C. Lei

(57) ABSTRACT

The present invention provides a manufacturing method of an OLED display panel and an OLED display panel. The manufacturing method of the OLED display panel of the present invention utilizes an inverted OLED element and manufactures an interface modification layer between the cathode of the OLED element and the light emitting layer by ink jet printing with an interface modification printing liquid. The interface modification printing liquid comprises an electron transporting material, metal nanoparticles which are surface-modified, a surface tension modifier and a viscosity modifier. The interface modification layer is a material layer comprising the electron transporting material and the metal nanoparticles. The electron transporting material can enhance the injection and transport of carriers from the cathode. The strong local electric field generated by the metal nanoparticles with the surface plasma resonance can enhance the injection efficiency of the electrons.

4 Claims, 3 Drawing Sheets

(51) Int. Cl.
  *H01L 51/50* (2006.01)
  *H01L 51/00* (2006.01)
  *H01L 27/32* (2006.01)
(52) U.S. Cl.
  CPC ...... *H01L 51/0022* (2013.01); *H01L 51/5008* (2013.01); *H01L 51/5092* (2013.01); *H01L 27/3246* (2013.01); *H01L 51/5234* (2013.01); *H01L 2251/5353* (2013.01); *H01L 2251/5369* (2013.01)
(58) Field of Classification Search
  CPC ............. H01L 51/5206; H01L 51/5221; H01L 51/5237; H01L 51/5256; H01L 51/301; H01L 51/303; H01L 51/5338
  USPC ..................................................... 257/40, 50
  See application file for complete search history.

MANUFACTURING METHOD OF ORGANIC LIGHT EMITTING DIODE DISPLAY PANEL AND ORGANIC LIGHT EMITTING DIODE DISPLAY PANEL

CROSS REFERENCE TO RELATED APPLICATIONS

This is a divisional application of co-pending U.S. patent application Ser. No. 15/557,130, filed on Sep. 11, 2017, which is a national stage of PCT Application No. PCT/CN2017/092681, filed on Jul. 13, 2017, claiming foreign priority of Chinese Patent Application No. 201710393573.9, filed on May 27, 2017.

FIELD OF THE INVENTION

The present invention relates to a display field, more particularly to a manufacturing method of an organic light emitting diode display panel and an organic light emitting diode display panel.

BACKGROUND OF THE INVENTION

The Organic Light Emitting Display (OLED) possesses many outstanding properties of self-illumination, low driving voltage, high luminescence efficiency, short response time, high clarity and contrast, near 180 degree view angle, wide range of working temperature, applicability of flexible display and large scale full color display. The OLED is considered as the most potential display panel.

The OLED display element generally comprises a substrate, an anode located on the substrate, a hole injection layer located on the anode, a hole transporting layer located on the hole injection layer, an emitting layer located on the hole transporting layer, an electron transporting layer located on the emitting layer, an electron injection layer located on the electron transporting layer and a cathode located on the electron injection layer. The principle of the OLED element is that the illumination generates due to the carrier injection and recombination under the electric field driving of the semiconductor material and the organic semiconductor illuminating material. Specifically, the ITO pixel electrode and the metal electrode are respectively employed as the anode and the cathode of the OLED element. Under certain voltage driving, the electron and the hole are respectively injected into the electron and hole transporting layers from the cathode and the anode. The electron and the hole respectively migrate from the electron and hole transporting layers to the emitting layer and bump into each other in the emitting layer to form an exciton to excite the emitting molecule. The latter can illuminate after the radiative relaxation.

In the Active Matrix (AM) organic light emitting diode display device, the Thin film transistor (TFT) controlling the OLED element is commonly manufactured at the side of the anode, which requires that the TFT has to be p type. The n type mobility of the regular amorphous silicon TFT and the polysilicon TFT is obviously larger than the p type mobility. The utilization of the inverted OLED element structure can make the n type thin film transistor of excellent performance be applied in the pixel circuit of the AMOLED display device to have more options for the driving circuit design of the AMOLED display device.

In the Active Matrix (AM) organic light emitting diode display device, the Thin film transistor (TFT) controlling the OLED element is commonly manufactured at the side of the anode, which requires that the TFT has to be p type. The n type mobility of the regular amorphous silicon TFT and the polysilicon TFT is obviously larger than the p type mobility. The method is to drop the function material ink into the predetermined pixel areas with a plurality of nozzles. Then, the required pattern is formed after the solvent is evaporated.

The metal nanoparticles provide many excellent optical and electrical properties with their special volume effect, quantum size effect, surface effect and macroscopic quantum tunneling effect.

SUMMARY OF THE INVENTION

An objective of the present invention is to provide a manufacturing method of an organic light emitting diode display panel. An inverted OLED element is utilized and an interface modification layer comprising an electron transporting material and metal nanoparticles is configured between the cathode and the light emitting layer to effectively promote the overall performance of OLED element and the manufacturing method is simple.

Another objective of the present invention is to provide an organic light emitting diode display panel. An inverted OLED element is utilized and an interface modification layer comprising an electron transporting material and metal nanoparticles is configured between the cathode and the light emitting layer to effectively promote the overall performance of OLED element and the manufacturing method is simple.

For realizing the aforesaid objectives, the present invention provides a manufacturing method of an organic light emitting diode display panel, wherein the organic light emitting diode display panel comprises a substrate and a plurality of organic light emitting diode elements configured on the substrate, the organic light emitting diode element is an inverted organic light emitting diode element and comprises a cathode, a light emitting layer and an anode from bottom to top in order, an interface modification layer is configured between the cathode and the light emitting layer; wherein a manufacturing method of the interface modification layer comprises: providing an interface modification printing liquid, wherein the interface modification printing liquid comprises an electron transporting material, metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the interface modification printing liquid on the cathode by ink jet printing to form the interface modification layer comprising the electron transporting material and the metal nanoparticles.

The metal nanoparticles are gold nanoparticles, silver nanoparticles or copper nanoparticles; the metal nanoparticles are metal nanoparticles which are modified by organic amine in the interface modification printing liquid; the electron transporting material is zinc oxide or titanium oxide.

The surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines.

In the organic light emitting diode element, at least one of a hole injection layer and a hole transporting layer is configured between the anode and the light emitting layer; a material of the anode comprises at least one of gold and silver.

In one preferred embodiment, the manufacturing method of the organic light emitting diode display panel comprises steps of:

Step S1, providing the substrate and forming a pixel definition layer on the substrate, wherein a plurality of through holes are spaced and configured in the pixel definition layer; a plurality of cathodes are respectively formed in the plurality of through holes;

Step S2, providing the interface modification printing liquid and coating the interface modification printing liquid on the plurality of cathodes by ink jet printing to respectively obtain a plurality of interface modification layers;

Step S3, respectively forming a plurality of light emitting layers on the plurality of interface modification layers; respectively forming a plurality of hole transporting layers on the plurality of light emitting layers; respectively forming a plurality of anodes on the plurality of hole transporting layers; respectively the plurality of organic light emitting diode elements in the plurality of through holes in the pixel definition layer.

In Step S1, the cathodes are formed by magnetron sputtering and a material of the cathodes is a transparent conductive metal oxide substance;

in Step S2, the electron transporting material in the interface modification printing liquid is zinc oxide and the metal nanoparticles are gold nanoparticles;

in Step S3, the light emitting layers are formed by ink jet printing; a material of the light emitting layers comprises poly(9,9-noctylfluorene-2,7-diyl);

in Step S3, the hole transporting layers and the anodes are formed by vacuum evaporation; a material of the hole transporting layers is molybdenum oxide; a material of the anodes is silver.

The present invention further provides an organic light emitting diode display panel, comprising a substrate and a plurality of organic light emitting diode elements, the organic light emitting diode element is an inverted organic light emitting diode element and comprises a cathode, a light emitting layer and an anode from bottom to top in order, an interface modification layer is configured between the cathode and the light emitting layer; wherein the interface modification layer is formed by ink jet printing with an interface modification printing liquid, wherein the interface modification printing liquid comprises an electron transporting material, metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles and the interface modification layer comprises the electron transporting material and the metal nanoparticles.

The metal nanoparticles are gold nanoparticles, silver nanoparticles or copper nanoparticles; the metal nanoparticles are metal nanoparticles which are modified by organic amine in the interface modification printing liquid; the electron transporting material is zinc oxide or titanium oxide; the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines; a material of the anode comprises at least one of gold and silver.

The organic light emitting diode display panel further comprises a pixel definition layer configured on the substrate, wherein a plurality of through holes are spaced and configured in the pixel definition layer and the plurality of organic light emitting diode elements are respectively arranged in the plurality of through holes.

The organic light emitting diode element comprises a cathode, an interface modification layer, a light emitting layer, a hole transporting layer and an anode from bottom to top in order.

A material of the cathodes is a transparent conductive metal oxide substance; in the interface modification layer, a material of the electron transporting layers is zinc oxide and the metal nanoparticles are gold nanoparticles; a material of the light emitting layers comprises poly(9,9-noctylfluorene-2,7-diyl); a material of the hole transporting layers is molybdenum oxide; a material of the anodes is silver.

The present invention further provides a manufacturing method of an organic light emitting diode display panel, wherein the organic light emitting diode display panel comprises a substrate and a plurality of organic light emitting diode elements configured on the substrate, the organic light emitting diode element is an inverted organic light emitting diode element and comprises a cathode, a light emitting layer and an anode from bottom to top in order, an interface modification layer is configured between the cathode and the light emitting layer; wherein a manufacturing method of the interface modification layer comprises: providing an interface modification printing liquid, wherein the interface modification printing liquid comprises an electron transporting material, metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the interface modification printing liquid on the cathode by ink jet printing to form the interface modification layer comprising the electron transporting material and the metal nanoparticles; wherein the metal nanoparticles are gold nanoparticles, silver nanoparticles or copper nanoparticles; the metal nanoparticles are metal nanoparticles which are modified by organic amine in the interface modification printing liquid; the electron transporting material is zinc oxide or titanium oxide; wherein the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines; wherein in the organic light emitting diode element, at least one of a hole injection layer and a hole transporting layer is configured between the anode and the light emitting layer; a material of the anode comprises at least one of gold and silver; wherein, the method comprises steps of:

Step S1, providing the substrate and forming a pixel definition layer on the substrate, wherein a plurality of through holes are spaced and configured in the pixel definition layer; a plurality of cathodes are respectively formed in the plurality of through holes;

Step S2, providing the interface modification printing liquid and coating the interface modification printing liquid on the plurality of cathodes by ink jet printing to respectively obtain a plurality of interface modification layers;

Step S3, respectively forming a plurality of light emitting layers on the plurality of interface modification layers; respectively forming a plurality of hole transporting layers on the plurality of light emitting layers; respectively forming a plurality of anodes on the plurality of hole transporting layers; respectively the plurality of organic light emitting diode elements in the plurality of through holes in the pixel definition layer.

The benefits of the present invention are: in the manufacturing method of the OLED display panel provided by the present invention, an inverted OLED element is utilized and an interface modification layer is manufactured between the cathode of the OLED element and the light emitting layer by ink jet printing with an interface modification printing liquid. The interface modification printing liquid comprises an electron transporting material, metal nanoparticles which are surface-modified, a surface tension modifier and a viscosity modifier, wherein the metal nanoparticles are surface-modified metal nanoparticles to inhibit agglomeration of the metal nanoparticles and to enhance a solubility of the metal nanoparticles. Namely, the interface modification layer is a material layer comprising the electron transporting material and the metal nanoparticles. The electron transporting material can enhance the injection and transport of carriers from the cathode. The strong local electric field generated by the metal nanoparticles with the surface plasma resonance can enhance the injection efficiency of the electrons. With the configuration of the interface modification layer between the cathode of the OLED element and the light emitting layer, the overall performance of OLED element can be effectively promoted and the manufacturing method is simple. In the OLED display panel of the present invention, the organic light emitting diode element is an inverted organic light emitting diode element and an interface modification layer is configured between the cathode and the light emitting layer. The interface modification layer is formed by ink jet printing with an interface modification printing liquid. The interface modification printing liquid comprises an electron transporting material, surface-modified metal nanoparticles, a surface tension modifier and a viscosity modifier. By applying the interface modification layer to the OLED element, the overall performance of OLED element can be effectively promoted and the manufacturing method is simple.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 1:
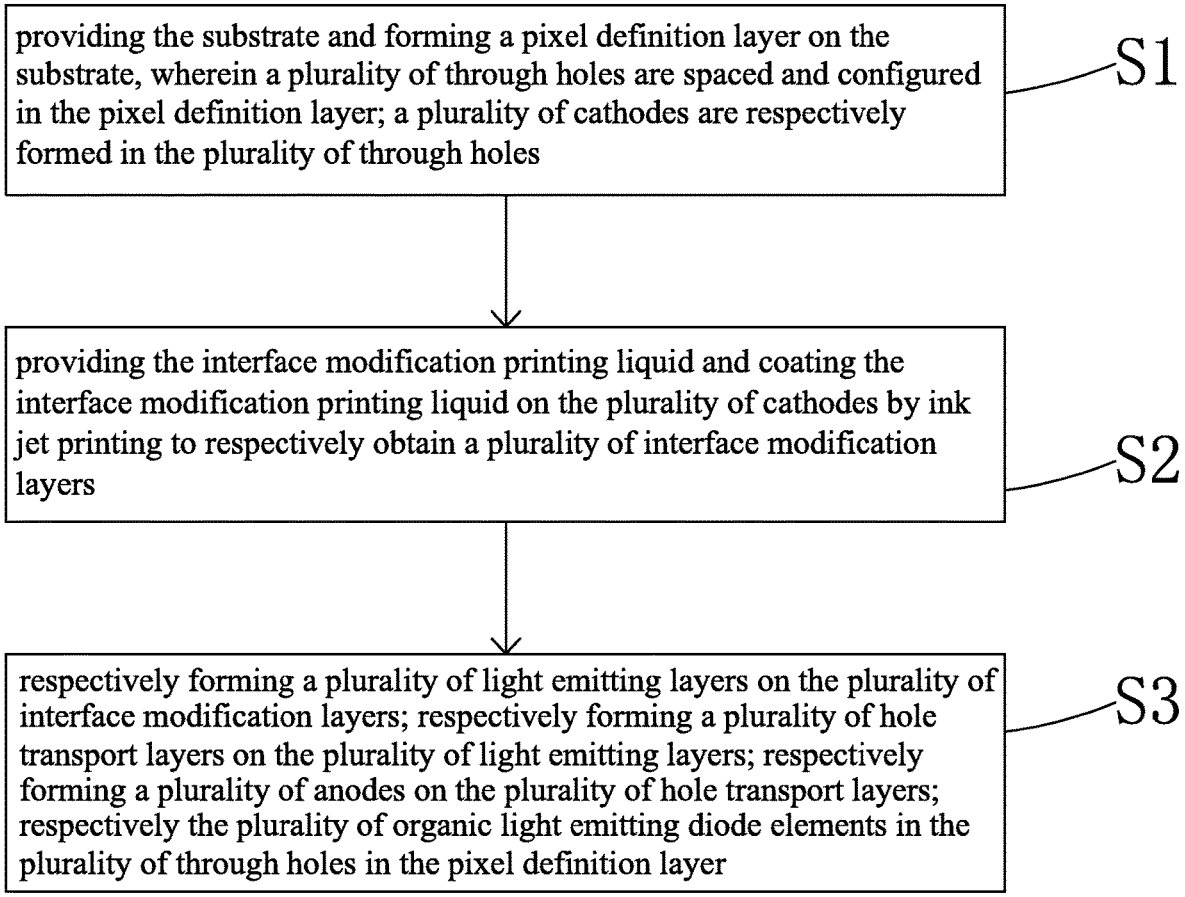
FIG. 1 is a flowchart of a preferred embodiment of a manufacturing method of an organic light emitting diode display panel according to the present invention.

For better explaining the technical solution and the effect of the present invention, the present invention will be further described in detail with the accompanying drawings and the specific embodiments.

The present invention first provides a manufacturing method of an organic light emitting diode display panel. The organic light emitting diode display panel comprises a substrate 10 and a plurality of organic light emitting diode elements 30 configured on the substrate 10, the organic light emitting diode 30 is inverted organic light emitting diode and comprises a cathode 31, a light emitting layer 32 and an anode 33 from bottom to top in order, an interface modification layer 34 is configured between the cathode 31 and the light emitting layer 32; a manufacturing method of the interface modification layer 34 comprises: providing an interface modification printing liquid, wherein the interface modification printing liquid comprises an electron transporting material, metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; and then coating the interface modification printing liquid on the cathode 31 by ink jet printing to form the interface modification layer 34 comprising the electron transporting material and the metal nanoparticles.

Specifically, the electron transporting material in the interface modification layer 34 is mainly to enhance the injection and transport of carriers from the cathode 31. The zinc oxide (ZnO) or the titanium oxide (TiOx) can be utilized.

Specifically, the interface modification layer 34 containing the metal nanoparticles is configured between the cathode 31 and the light emitting layer 32. Mainly, the strong local electric field generated by the metal nanoparticles with the surface plasma resonance is utilized to enhance the injection efficiency of the electrons and to improve the performance of the organic light emitting diode element 30. The metal nanoparticles are preferably nanoparticles of highly conductive inert metals such as gold, silver and copper.

Specifically, the surfaces of the metal nanoparticles have organic amine ligands, i.e. the metal nanoparticles are metal nanoparticles which are modified by organic amine in the interface modification printing liquid. On one hand, the long chain organic amine ligands can effectively inhibit agglomeration among the metal nanoparticles to reduce carrier traps on the metal nanoparticles; on the other hand, the introduction of the organic amine ligands can enhance the solubility of the metal nanoparticles in a common organic solvent so that the prepared metal nanoparticles can be better applied to the solution processing process. Preferably, the organic amine is a long chain alkylamine having a carbon chain length larger than or equal to 16.

Specifically, the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines. For instance, the viscosity modifier can be polyhydric alcohol or glycol ether.

Specifically, in the organic light emitting diode element 30, at least one of a hole injection layer and a hole transporting layer is configured between the anode 33 and the light emitting layer 32.

The existing OLED elements generally use low work function metals, such as magnesium (Mg), calcium (Ca), lithium (Li) and cesium (Cs) as electrodes. However, these metals are highly chemically active and tend to degrade the element performance. Meanwhile, the OLED element mass production process control difficulty is also increased. The present invention utilizes the inverted structure organic light emitting diode element 30 and chooses high work function metals, such as gold (Au) or silver (Ag) as the anode 33. The stability of the electrode of the OLED element 30 can be effectively promoted, which is conducive to further improve the stability and the service lifetime of the element.

Specifically, a material of the anode 33 is a metal of high work function and comprises at least one of gold and silver.

Figure 2:
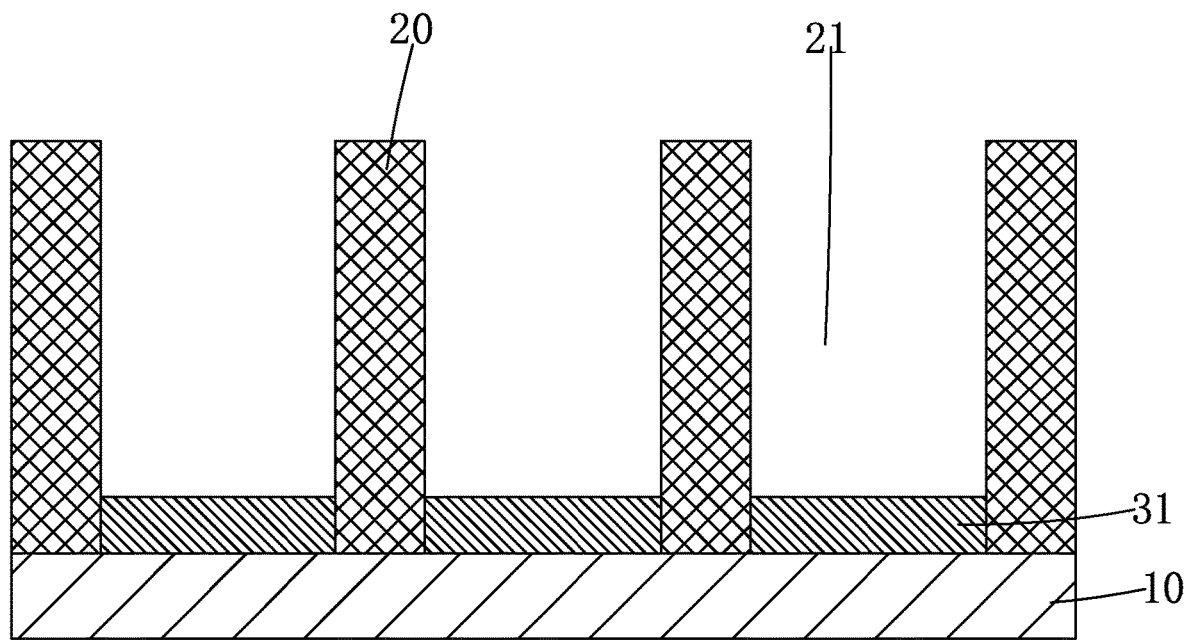
FIG. 2 is a diagram of Step S1 of a preferred embodiment of a manufacturing method of an organic light emitting diode display panel according to the present invention.

Specifically, as shown in FIG. 1, which is a flowchart of a preferred embodiment of a manufacturing method of an organic light emitting diode display panel according to the present invention, comprising steps of:

Step 1, as shown in FIG. 2, providing the substrate 10 and forming a pixel definition layer 20 on the substrate 10, wherein a plurality of through holes 21 are spaced and configured in the pixel definition layer 20; a plurality of cathodes 31 are respectively formed in the plurality of through holes 21.

Specifically, the substrate 10 is a substrate with a TFT array and TFTs in the TFT array are n type TFTs.

In Step S1, the cathodes 31 are formed by magnetron sputtering and a material of the cathodes 31 is a transparent conductive metal oxide substance and preferably is Indium Tin Oxide (ITO).

Specifically, a thickness of the cathodes 31 is in a range of 20 nm to 200 nm.

Figure 3:
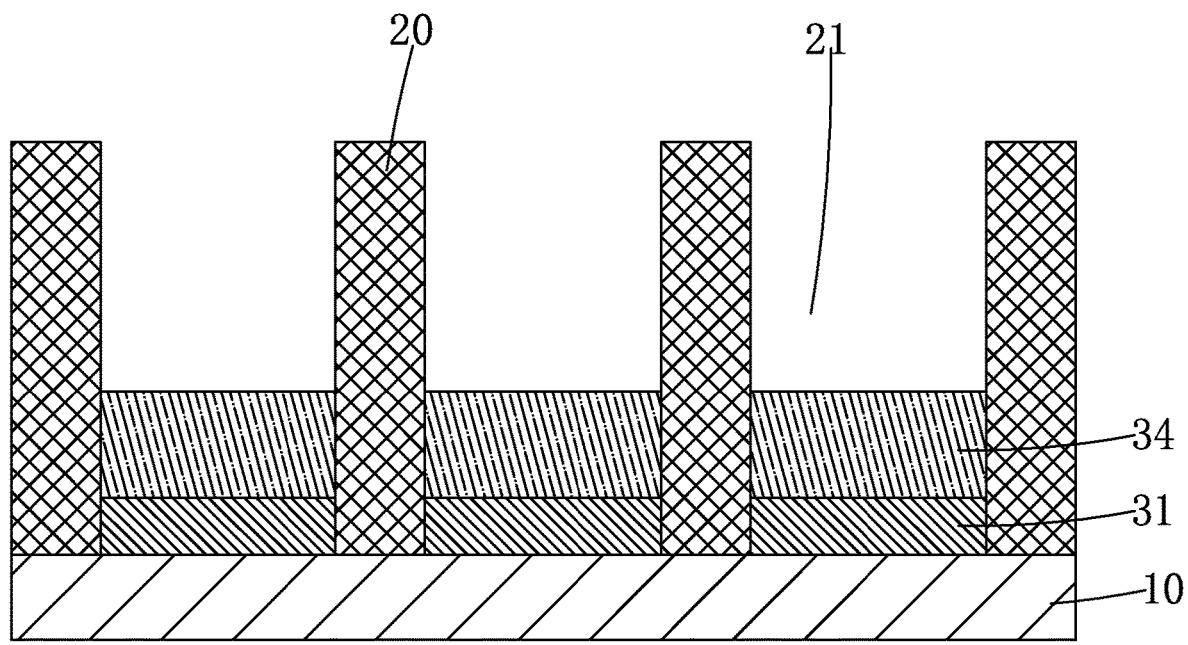
FIG. 3 is a diagram of Step S2 of a preferred embodiment of a manufacturing method of an organic light emitting diode display panel according to the present invention.

Step S2, as shown in FIG. 3, providing the interface modification printing liquid and coating the interface modification printing liquid on the plurality of cathodes 31 by ink jet printing to respectively obtain a plurality of interface modification layers 34.

Specifically, a thickness of the interface modification layers 34 is in a range of 1 nm to 200 nm.

Specifically, in Step S2, the electron transporting material in the interface modification layer 34 is zinc oxide and the metal nanoparticles are gold nanoparticles. The specific manufacturing process of the interface modification printing liquid is:

1. preparation of gold nanoparticles which are modified by organic amine and the solution thereof:

1.1 dissolving gold chloride ($AuCl_3$) in the solvent of the alkylamine.

1.2 vacuuming the system first and then, passing nitrogen, repeating the aforesaid steps three times to remove water and oxygen in the system.

1.3 heating to the system reflux, heating and stirring to complete reaction and cooling to the room temperature to obtain the gold nanoparticles which are modified by organic amine and the solution thereof.

2. Preparation of ZnO nanoparticle solution: mixing the ZnO nanoparticle solution with the aforesaid prepared solution of the gold nanoparticles and then, adding a surface tension modifier and a viscosity modifier in the mixed solution to adjust the physical properties for being suitable for ink jet printing to obtain the interface modification printing liquid.

Figure 4:
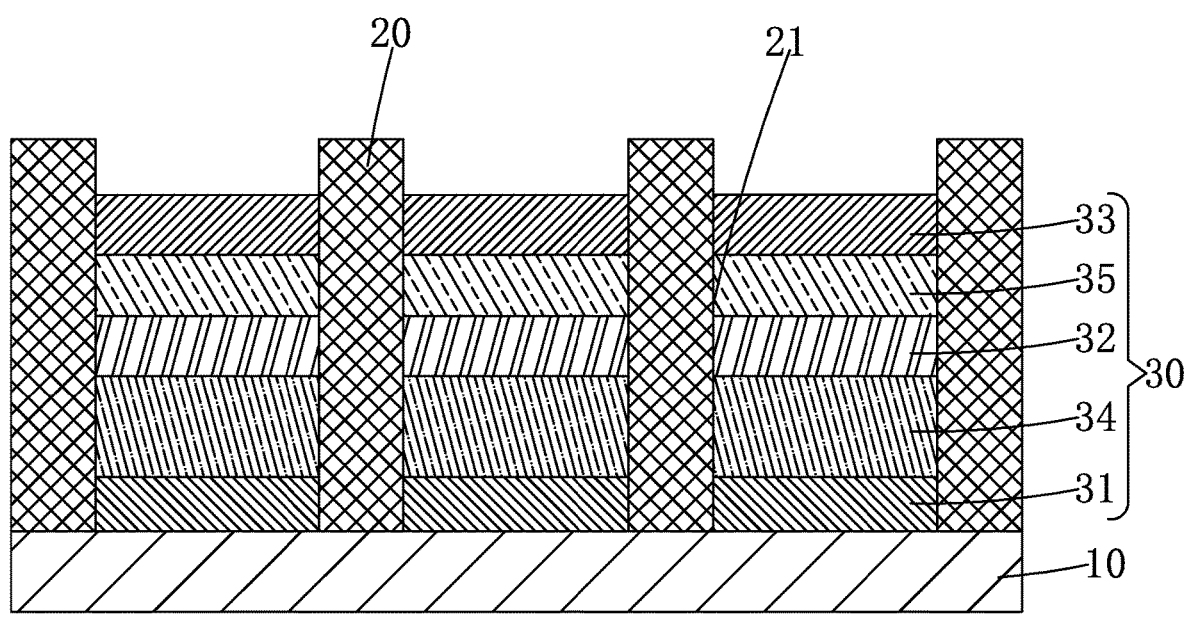
FIG. 4 is a diagram of Step S3 of a preferred embodiment of a manufacturing method of an organic light emitting diode display panel according to the present invention and also a structure diagram of a preferred embodiment of an organic light emitting diode display panel according to the present invention.

Step S3, as shown in FIG. 4, respectively forming a plurality of light emitting layers 32 on the plurality of interface modification layers 34; respectively forming a plurality of hole transporting layers 35 on the plurality of light emitting layers 32; respectively forming a plurality of anodes 33 on the plurality of hole transporting layers 35; respectively the plurality of organic light emitting diode elements 30 in the plurality of through holes 21 in the pixel definition layer 20.

Specifically, in Step S3, the light emitting layers 32 are formed by ink jet printing; a material of the light emitting layers 32 comprises poly(9,9-noctylfluorene-2,7-diyl) (PFO); the poly(9,9-noctylfluorene-2,7-diyl) is a blue luminescent material.

Specifically, a thickness of the light emitting layers 32 is in a range of 1 nm to 100 nm.

Specifically, in Step S3, the hole transporting layers 35 and the anodes 33 are formed by vacuum evaporation; a material of the hole transporting layers 35 is molybdenum oxide ($MoO_3$); a material of the anodes 33 is silver.

Specifically, a thickness of the hole transporting layers 35 is in a range of 0.5 nm to 50 nm and a thickness of the anodes 33 is in a range of 10 nm to 2000 nm.

In the manufacturing method of the OLED display panel of the present invention, an inverted OLED element is utilized and an interface modification layer 34 is manufactured between the cathode 31 and the light emitting layer 32 by ink jet printing with an interface modification printing liquid. The interface modification printing liquid comprises an electron transporting material, metal nanoparticles which are surface-modified, a surface tension modifier and a viscosity modifier, wherein the metal nanoparticles are surface-modified metal nanoparticles to inhibit agglomeration of the metal nanoparticles and to enhance a solubility of the metal nanoparticles. Namely, the interface modification layer 34 is a material layer comprising the electron transporting material and the metal nanoparticles. The electron transporting material can enhance the injection and transport of carriers from the cathode 31. The strong local electric field generated by the metal nanoparticles with the surface plasma resonance can enhance the injection efficiency of the electrons. With the configuration of the interface modification layer 34 between the cathode 31 of the OLED element 30 and the light emitting layer 32, the overall performance of OLED element can be effectively promoted and the manufacturing method is simple.

On the base of the aforesaid manufacturing method of the organic light emitting diode display panel, the present invention further provides an organic light emitting diode display panel manufactured by the aforesaid manufacturing method of the organic light emitting diode display panel. The method comprises a substrate 10 and a plurality of organic light emitting diode elements configured on the substrate 10, the organic light emitting diode 30 is inverted organic light emitting diode and comprises a cathode 31, a light emitting layer 32 and an anode 33 from bottom to top in order, an interface modification layer 34 is configured between the cathode 31 and the light emitting layer 32; the interface modification layer 34 is formed by ink jet printing with an interface modification printing liquid, wherein the interface modification printing liquid comprises an electron transporting material, surface-modified metal nanoparticles, a surface tension modifier and a viscosity modifier.

Specifically, the electron transporting material in the interface modification layer 34 is zinc oxide or titanium oxide.

Specifically, the metal in the metal nanoparticles is gold, silver or copper i.e. the metal nanoparticles are gold nanoparticles, silver nanoparticles or copper nanoparticles.

Specifically, the surfaces of the metal nanoparticles have organic amine ligands, i.e. the metal nanoparticles are metal nanoparticles which are modified by organic amine in the interface modification printing liquid to inhibit agglomeration among the metal nanoparticles and to enhance the solubility of the metal nanoparticles. Preferably, the organic amine is a long chain alkylamine having a carbon chain length larger than or equal to 16.

Specifically, the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines. For instance, the viscosity modifier can be polyhydric alcohol or glycol ether.

Specifically, in the organic light emitting diode element 30, at least one of a hole injection layer and a hole transporting layer is configured between the anode 33 and the light emitting layer 32.

Specifically, a material of the anode 33 is a metal of high work function and comprises at least one of gold and silver. The stability of the electrode of the OLED element 30 can be effectively promoted, which is conducive to further improve the stability and the service lifetime of the element.

Specifically, as shown in FIG. 4, which is a preferred embodiment of an organic light emitting diode display panel according to the present invention, the organic light emitting diode display panel comprises a substrate 10 and a plurality of organic light emitting diode elements 30 configured on the substrate 10 and a pixel definition layer 20 configured on the substrate 10. A plurality of through holes 21 are spaced and configured in the pixel definition layer 20 and the plurality of organic light emitting diode elements 30 are respectively arranged in the plurality of through holes 21; the organic light emitting diode element 30 comprises a cathode 31, an interface modification layer 34, a light emitting layer 32, a hole transporting layer 35 and an anode 33 from bottom to top in order.

Specifically, a material of the cathodes 31 is a transparent conductive metal oxide substance; in the interface modification layer 34, a material of the electron transporting layers is zinc oxide and the metal nanoparticles are gold nanoparticles; a material of the light emitting layers 32 comprises poly(9,9-noctylfluorene-2,7-diyl); a material of the hole transporting layers 35 is molybdenum oxide; a material of the anodes 33 is silver.

In the OLED display panel of the present invention, the organic light emitting diode element 30 has an inverted structure and an interface modification layer 34 is configured between the cathode 31 and the light emitting layer 32 of the OLED element 30. The interface modification layer 34 is formed by ink jet printing with an interface modification printing liquid. The interface modification printing liquid comprises an electron transporting material, surface-modified metal nanoparticles, a surface tension modifier and a viscosity modifier. By applying the interface modification layer 34 to the OLED element 30, the overall performance of OLED element 30 can be effectively promoted and the manufacturing method is simple.

In conclusion, the manufacturing method of the OLED display panel of the present invention utilizes an inverted OLED element and manufactures an interface modification layer between the cathode and the light emitting layer by ink jet printing with an interface modification printing liquid. The interface modification printing liquid comprises an electron transporting material, metal nanoparticles which are surface-modified, a surface tension modifier and a viscosity modifier, wherein the metal nanoparticles are surface-modified metal nanoparticles to inhibit agglomeration of the metal nanoparticles and to enhance a solubility of the metal nanoparticles. Namely, the interface modification layer is a material layer comprising the electron transporting material and the metal nanoparticles. The electron transporting material can enhance the injection and transport of carriers from the cathode. The strong local electric field generated by the metal nanoparticles with the surface plasma resonance can enhance the injection efficiency of the electrons. With the configuration of the interface modification layer between the cathode of the OLED element and the light emitting layer, the overall performance of OLED element can be effectively promoted and the manufacturing method is simple. In the OLED display panel of the present invention, the organic light emitting diode element is an inverted organic light emitting diode element and a interface modification layer is configured between the cathode and the light emitting layer. The interface modification layer is formed by ink jet printing with an interface modification printing liquid. The interface modification printing liquid comprises an electron transporting material, surface-modified metal nanoparticles, a surface tension modifier and a viscosity modifier. By applying the interface modification layer to the OLED element, the overall performance of OLED element can be effectively promoted and the manufacturing method is simple.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode display panel, comprising a substrate and a plurality of organic light emitting diode elements, the organic light emitting diode element is an inverted organic light emitting diode element and comprises a cathode, a light emitting layer and an anode from bottom to top in order, an interface modification layer is configured between the cathode and the light emitting layer; wherein the interface modification layer is formed by ink jet printing with an interface modification printing liquid, wherein the interface modification printing liquid comprises an electron transporting material, metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles and the interface modification layer comprises the electron transporting material and the metal nanoparticles.

2. The organic light emitting diode display panel according to claim 1, wherein the metal nanoparticles are gold nanoparticles, silver nanoparticles or copper nanoparticles;

the metal nanoparticles are metal nanoparticles which are modified by organic amine in the interface modification printing liquid;

the electron transporting material is zinc oxide or titanium oxide;

the surface tension modifier is a combination of one or more of a co-solvent, a surfactant, an imidazole and a derivative thereof, phenol, and hydroquinone;

the viscosity modifier is a combination of one or more of alcohols, ethers, esters, phenols and amines;

a material of the anode comprises at least one of gold and silver.

3. The organic light emitting diode display panel according to claim 1, further comprising a pixel definition layer configured on the substrate, wherein a plurality of through holes are spaced and configured in the pixel definition layer and the plurality of organic light emitting diode elements are respectively arranged in the plurality of through holes;

The organic light emitting diode element comprises a cathode, an interface modification layer, a light emitting layer, a hole transporting layer and an anode from bottom to top in order.

4. The organic light emitting diode display panel according to claim 3, wherein a material of the cathodes is a transparent conductive metal oxide substance; in the interface modification layer, a material of the electron transporting layers is zinc oxide and the metal nanoparticles are gold nanoparticles; a material of the light emitting layers comprises poly(9,9-noctylfluorene-2,7-diyl); a material of the hole transporting layers is molybdenum oxide; a material of the anodes is silver.

* * * * *